(12) United States Patent
Cho et al.

(10) Patent No.: US 12,713,990 B2
(45) Date of Patent: Aug. 18, 2026

(54) SEMICONDUCTOR PACKAGE

(71) Applicant: SAMSUNG ELECTRONICS CO., LTD., Suwon-si (KR)

(72) Inventors: Eunho Cho, Suwon-si (KR); Jihwang Kim, Cheonan-si (KR); Sunchul Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 508 days.

(21) Appl. No.: 17/712,489

(22) Filed: Apr. 4, 2022

(65) Prior Publication Data

US 2023/0063578 A1 Mar. 2, 2023

(30) Foreign Application Priority Data

Aug. 27, 2021 (KR) ........................ 10-2021-0114056

(51) Int. Cl.
*H10W 90/00* (2026.01)
*H10W 70/685* (2026.01)
*H10W 74/10* (2026.01)

(52) U.S. Cl.
CPC ....... *H10W 90/701* (2026.01); *H10W 70/685* (2026.01); *H10W 74/114* (2026.01); *H10W 90/401* (2026.01)

(58) Field of Classification Search
CPC ........... H01L 23/49811; H01L 25/0657; H01L 24/15; H10W 90/00; H10W 90/701
See application file for complete search history.

(56) References Cited

U.S. PATENT DOCUMENTS 7,271,084 B2 9/2007 Jeong et al.
7,675,171 B2 3/2010 Lee
(Continued)

FOREIGN PATENT DOCUMENTS

KR 10-2010-0066821 A 6/2010
KR 10-2015-0092881 A 8/2015

OTHER PUBLICATIONS

Enepig IPC-4556 from Sierra Circuit Proto Express (2025) (retrieved from https://www.protoexpress.com/kb/enepig-surface-finish/) (Year: 2025).*

(Continued)

*Primary Examiner* — Michele Fan
(74) *Attorney, Agent, or Firm* — Sughrue Mion, PLLC

(57) ABSTRACT

A semiconductor package is provided. The semiconductor package includes: a lower substrate including a lower wiring layer; a semiconductor chip disposed on the lower substrate, and electrically connected to the lower wiring layer; an upper substrate disposed on the semiconductor chip, and including an upper wiring layer; a first connection structure disposed on the lower wiring layer, and having a first hollow open toward the upper substrate; a second connection structure disposed below the upper wiring layer, and having a second hollow open toward the lower substrate; a conductive connection member disposed between the first connection structure and the second connection structure, and filling at least a portion of the first hollow; and an encapsulant disposed between the lower substrate and the upper substrate, and encapsulating at least a portion of each of the semiconductor chip, the first connection structure and the second connection structure.

20 Claims, 21 Drawing Sheets

(56) References Cited

U.S. PATENT DOCUMENTS

| | | | | |
|---|---|---|---|---|
| 8,093,728 | B2 | 1/2012 | Marion | |
| 8,898,896 | B2 | 12/2014 | Marion et al. | |
| 9,627,347 | B2 | 4/2017 | Aoyagi et al. | |
| 10,056,347 | B2 | 8/2018 | Chiu et al. | |
| 10,504,870 | B2 | 12/2019 | Lin et al. | |
| 2004/0197979 | A1* | 10/2004 | Jeong | H01L 24/13 257/E21.511 |
| 2010/0072631 | A1* | 3/2010 | Marion | H01L 24/12 228/244 |
| 2014/0091471 | A1* | 4/2014 | Chen | H01L 21/6836 257/770 |
| 2016/0351543 | A1 | 12/2016 | Ryu et al. | |
| 2018/0040599 | A1 | 2/2018 | Huang et al. | |
| 2019/0131261 | A1 | 5/2019 | Yu et al. | |
| 2022/0319943 | A1* | 10/2022 | Mok | H01L 21/4857 |

OTHER PUBLICATIONS

Communication issued on Jun. 11, 2025 from the Korean Intellectual Property Office for Korean Patent Application No. 10-2021-0114056.

* cited by examiner

SEMICONDUCTOR PACKAGE

CROSS-REFERENCE TO RELATED APPLICATION

This application is based on and claims priority under 35 U.S.C. § 119(a) to Korean Patent Application No. 10-2021-0114056, filed on Aug. 27, 2021, in the Korean Intellectual Property Office, the disclosure of which is incorporated by reference herein in its entirety.

BACKGROUND

1. Field

The inventive concept relates to a semiconductor package, and more particularly, to a semiconductor package with improved connection structure.

2. Description of Related Art

With a recent trend for high performance and miniaturization in electronic devices, a package-on-package (POP) technology in which an upper package and a lower package are vertically stacked has been developed. In the lower package of the POP structure, reliability of a connection structure may be determined according to an alignment state of a lower substrate and an upper substrate. Therefore, it is necessary to develop a technology for preventing misalignment of the lower substrate and the upper substrate, and stably forming the connection structure.

SUMMARY

An aspect of the inventive concept is to provide a semiconductor package having improved reliability.

According to an embodiment, there is provided a semiconductor package including: a lower substrate including a lower wiring layer; a semiconductor chip disposed on the lower substrate, and electrically connected to the lower wiring layer; an upper substrate disposed on the semiconductor chip, and including an upper wiring layer; a first connection structure disposed on the lower wiring layer, and having a first hollow open toward the upper substrate; a second connection structure disposed below the upper wiring layer, and having a second hollow open toward the lower substrate; a conductive connection member disposed between the first connection structure and the second connection structure, and filling at least a portion of the first hollow; and an encapsulant disposed between the lower substrate and the upper substrate, and encapsulating at least a portion of each of the semiconductor chip, the first connection structure and the second connection structure, wherein the first connection structure is inserted into the second connection structure, and wherein the conductive connection member has a first lower end in the first hollow, and a second lower end adjacent to the lower substrate outside of the first hollow.

According to an embodiment, there is provided a semiconductor package including: a lower substrate including a lower wiring layer; a semiconductor chip disposed on the lower substrate, and electrically connected to the lower wiring layer; an upper substrate disposed on the semiconductor chip, and including an upper wiring layer; a first connection structure disposed on the lower wiring layer, and having a first hollow open toward the upper substrate; a second connection structure disposed below the upper wiring layer, and having a second hollow open toward the lower substrate; a conductive connection member disposed between the first connection structure and the second connection structure, and filling at least a portion of the first hollow; a first surface layer disposed on at least a portion of the first hollow, and in contact with the conductive connection member; and an encapsulant disposed between the lower substrate and the upper substrate, and encapsulating at least a portion of each of the semiconductor chip, the first connection structure and the second connection structure.

According to an embodiment, there is provided a semiconductor package including: a lower substrate including a lower wiring layer; a semiconductor chip disposed on the lower substrate, and electrically connected to the lower wiring layer; an upper substrate disposed on the semiconductor chip, and including an upper wiring layer; a first connection structure disposed on the lower wiring layer, and protruding toward the upper substrate; a second connection structure disposed below the upper wiring layer, and protruding toward the lower substrate to partially surround the first connection structure; a surface layer covering at least a portion of a surface of the first connection structure; and a conductive connection member extending along the surface layer between the first connection structure and the second connection structure.

BRIEF DESCRIPTION OF THE DRAWINGS

The above and other aspects, features, and advantages of the inventive concept will be more clearly understood from the following detailed description taken in conjunction with the accompanying drawings, in which.

DETAILED DESCRIPTION

Hereinafter, example embodiments of the inventive concept will be described with reference to the accompanying drawings as follows.

Figure 1A:
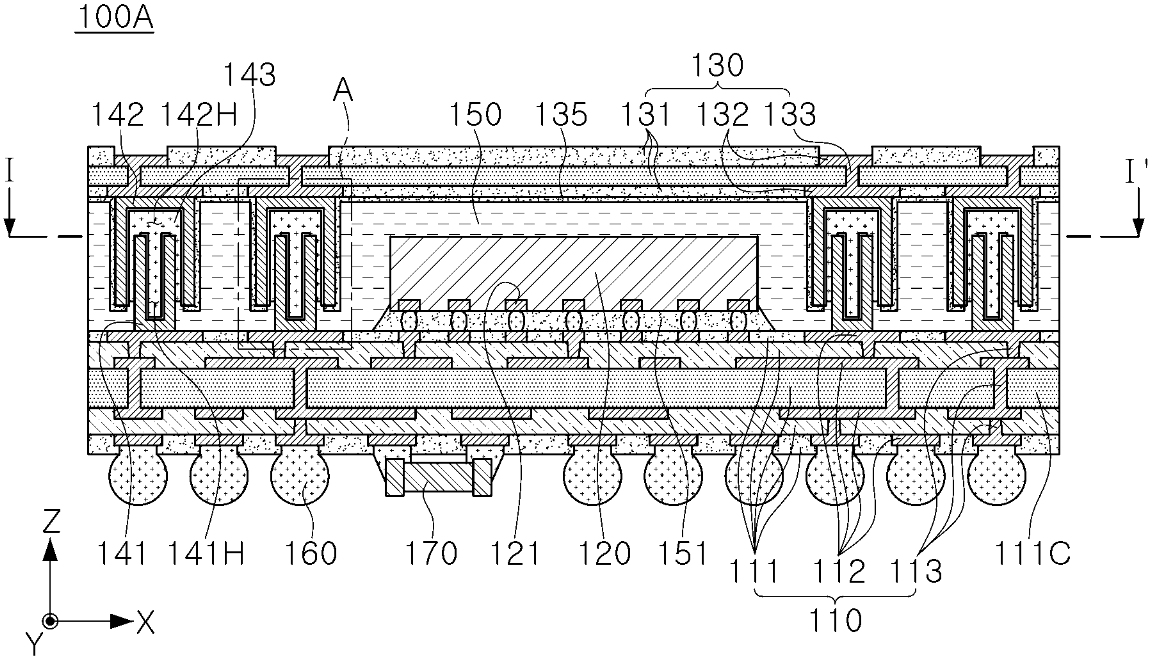
FIG. 1A is a cross-sectional view illustrating a semiconductor package according to an example embodiment.
Figure 1B:
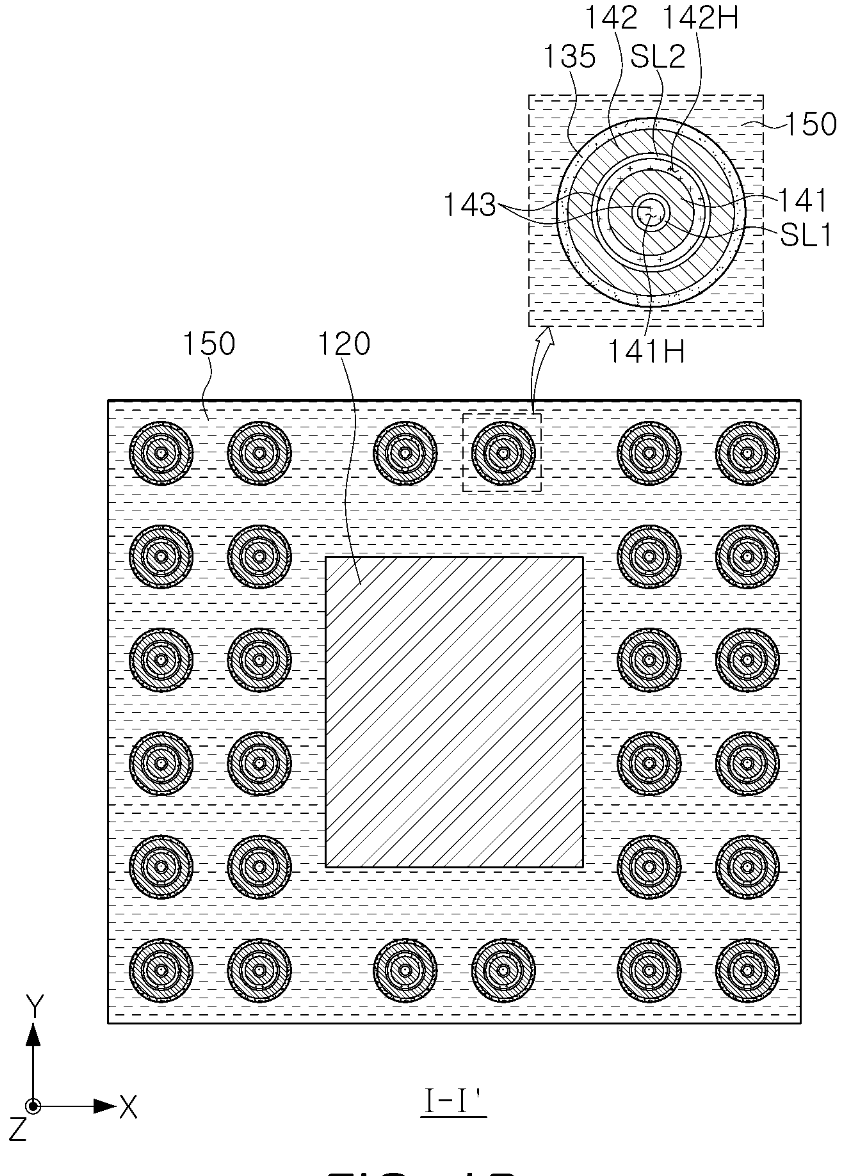
FIG. 1B is a plan view illustrating a cross-section taken along a line I-I' of FIG. 1A.
Figure 1C:
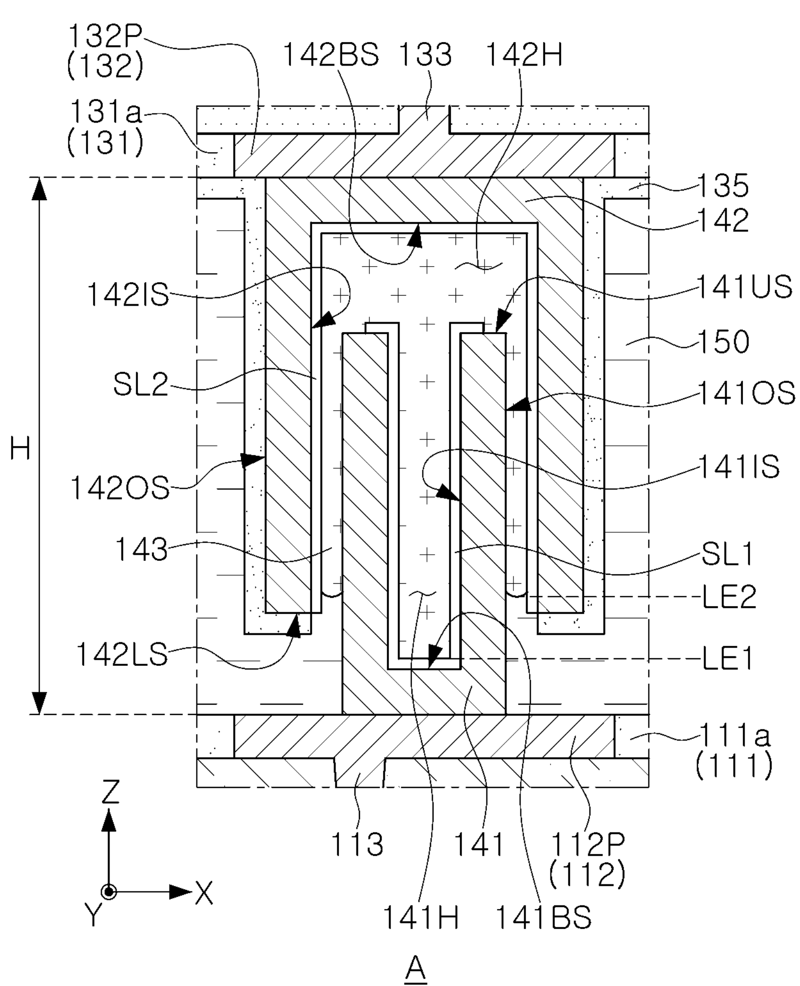
FIG. 1C is a partially enlarged view illustrating a region 'A' of FIG. 1A.

FIG. 1A is a cross-sectional view illustrating a semiconductor package 100A according to an example embodiment, FIG. 1B is a plan view illustrating a cross-section taken along a line I-I' of FIG. 1A, and FIG. 1C is a partially enlarged view illustrating a region 'A' of FIG. 1A.

Referring to FIGS. 1A and 1B, a semiconductor package 100A according to an example embodiment may include a lower substrate 110, a semiconductor chip 120, an upper substrate 130, a first connection structure 141, a second connection structure 142, and a conductive connection member 143. In addition, the semiconductor package 100A may further include an encapsulant 150, a connection bump 160 and/or a passive element 170.

According to the inventive concept of the disclosure, a conductive connecting member 143 for electrically connecting the first connecting structure 141 and the second connecting structure 142 may be interposed between the first connecting structure 141 and the second connecting structure 142 coupled in a male and female form, so that misalignment of the lower substrate 110 and the upper substrate 130 may be prevented. For example, the first connection structure 141 may have a structure in which wettability of the conductive connection member 143 is improved, so that occurrence of voids between the conductive connection member 143 and the first connection structure 141 may be minimized, and non-wetting or short defects of the conductive connection member 143 may be prevented. Therefore, according to the inventive concept, reliability of a connection structure thereof and the semiconductor package including the same may be improved. Hereinafter, each component included in the semiconductor package 100A according to an example embodiment will be described in detail with reference to the accompanying drawings.

The lower substrate 110 may be a support substrate on which a semiconductor chip 120 is mounted, and may be a package substrate including a lower wiring layer 112 for rewiring the semiconductor 120. The package substrate may include a printed circuit board (PCB), a ceramic substrate, a glass substrate, a tape wiring board, and the like. For example, the lower substrate 110 may include an insulating layer 111 (also, referred to as a lower insulating layer), a lower wiring layer 112, and a wiring via 113 (also, referred to as a lower wiring via).

The insulating layer 111 may include an insulating resin. The insulating resin may include a thermosetting resin such as an epoxy resin, a thermoplastic resin such as polyimide, or a resin impregnated with inorganic fillers or/and glass fibers (Glass Fiber, Glass Cloth, Glass Fabric) in these resins, for example, prepreg, Ajinomoto Build-up Film (ABF), FR-4, Bismaleimide Triazine (BT), or a photosensitive resin such as a Photoimageable Dielectric (PID). The insulating layer 111 may include a plurality of insulating layers 111 stacked in a vertical direction (Z-axis direction). Depending on the process, a boundary between the insulating layers 111 of different levels may be unclear. The lowermost and uppermost insulating layers among the plurality of insulating layers 111 may be a solder resist layer that protects the lower wiring layer 112 from external physical/chemical damage. The solder resist layer may include an insulating material, and may be formed using, for example, prepreg, ABF, FR-4, BT, or a photo solder resist (PSR). In addition, for convenience of explanation, only five-layer insulating layers 111 are illustrated in the drawings, but example embodiments of the inventive concept are not limited thereto. According to an example embodiment, a smaller or larger number of insulating layers 111 than those shown in the drawings may be formed. For example, a core insulating layer 111C disposed in a middle of the plurality of insulating layers 111 may be thicker than the insulating layers 111 stacked thereabove and therebelow. The core insulating layer 111C may improve rigidity of the substrate to suppress warpage of the substrate. The core insulating layer 111C may be formed using, for example, a copper clad laminate (CCL), an unclad copper clad laminate (Unclad CCL), a glass substrate or a ceramic substrate. According to an example embodiment, the lower substrate 110 may not include the core insulating layer 111C.

The lower wiring layer 112 may include, for example, copper (Cu), aluminum (Al), silver (Ag), tin (Sn), gold (Au), nickel (Ni), lead (Pb), titanium (Ti), or a metal material including alloys thereof. The lower wiring layer 112 may include, for example, a ground (GND) pattern, a power (PWR) pattern, and a signal (S) pattern. The signal (S) pattern may provide a path through which various signals, such as a data signal or the like, are transmitted/received. Here, the signal (S) pattern may not include the ground (GDN) pattern and the power (PWR) pattern. The lower wiring layer 112 may be provided as a plurality of lower wiring layers 112, where each of the plurality of lower wiring layers 112 is respectively disposed below the plurality of insulating layers 111. The plurality of lower wiring layers 112 may be electrically connected to each other through a wiring via 113. The lower wiring layer 112 may include a landing pad on which a semiconductor chip 120, a connection structure 140, a connection bump 160, and a passive element 170 are disposed. The landing pad may be formed to have a different pitch according to a mounted object. In one example, a lowermost lower wiring layer 112, in contact with the connection bump 160 may be formed to have a greater thickness than the lower wiring layers 112 disposed thereabove. The number of the lower wiring layers 112 may be determined according to the number of the insulating layers 111, and may include more or fewer layers than the lower wiring layers 112 shown in the drawings.

The wiring via 113 may be electrically connected to the lower wiring layer 112, and may include a signal via, a ground via, and a power via. The wiring via 113 may include, for example, copper (Cu), aluminum (Al), silver (Ag), tin (Sn), gold (Au), nickel (Ni), lead (Pb), titanium (Ti), or a metal material including alloys thereof. The wiring via 113 may have a form of a filled via in which a metal material is filled in a via hole or a form of a conformal via in which a metal material is formed along an inner wall of the via hole. The wiring via 113 may be integrated with the lower wiring layer 112, but example embodiments of the inventive concept are not limited thereto.

The semiconductor chip 120 may be disposed on a lower substrate 110, and may be electrically connected to a lower wiring layer 112. The semiconductor chip 120 may be mounted on the lower substrate 110 in a flip-chip method. The semiconductor chip 120 may be connected to the lower wiring layer 110 through a metal bump in a form of a ball or a post. For example, the semiconductor chip 120 may be electrically connected to the lower wiring layer 112 through a solder bump 120B, but it is not limited thereto. According to an example embodiment, the semiconductor chip 120 may be directly connected to the lower wiring layer 112 or a wiring via 113 without a separate bump, or may be mounted on the lower substrate 110 by wire bonding. The semiconductor chip 120 includes silicon (Si), germanium (Ge), or gallium arsenide (GaAs), and various types of integrated circuits may be formed therein. The integrated circuit may be a processor chip such as a central processor (e.g., CPU), a graphics processor (e.g., GPU), a field programmable gate array (FPGA), an application processor (AP), a digital signal processor, a cryptographic processor, a microprocessor, and the like, but an example embodiment is not limited thereto, and the integrated circuit may be a memory chip such as a logic chip such as a central processor (CPU), a graphics processor (GPU), a field programmable gate array (FPGA), a digital signal processor, an encryption processor, a microprocessor, a microcontroller, an analog-digital converter, an application-specific IC (ASIC), or a memory chip such as a volatile memory (e.g., dynamic random access memory (DRAM)), a non-volatile memory (e.g., read-only memory (ROM) and a flash memory).

The upper substrate 130 is a redistribution substrate providing a redistribution layer in an upper portion or a rear surface of the semiconductor package 100A, and may be referred as an interposer substrate disposed between the lower package and the upper package in a package-on-package structure. The upper substrate 130 may be disposed on the semiconductor chip 120, and may include an insulating layer 131 (or referred to as an upper insulating layer), an upper wiring layer 132, and a wiring via 133 (or referred to as an upper wiring via). The insulating layer 131, the upper wiring layer 132, and the wiring via 133 may have the same or similar characteristics to the lower insulating layer 111, the lower wiring layer 112, and the wiring via 113 of the lower substrate 110 described above, and thus overlapping descriptions thereof will be omitted. The upper insulating layer 131 may also be provided as a plurality of insulating layers. A second connection structure 142 electrically and physically connected to the upper wiring layer 132 may be disposed below the upper substrate 130. For example, a solder resist layer 135 for protecting the second connection structure 142 from external physical and/or chemical damages may be disposed on a lower surface of the upper substrate 130 and an outer side surface 142OS of the second connection structure 142. The solder resist layer 135 may be formed using, for example, a PSR. A structure of the second connection structure 142 covered by the solder resist layer 135 will be described with reference to FIG. 1C.

The first connection structure 141 and the second connection structure 142 may be arranged to face each other so that a connection structure (e.g., the first connection structure 1414) on any one side thereof may be inserted inside a connection structure (e.g., the second connection structure 142) on the other side thereof. The conductive connection member 143 may be disposed between the first and second connection structures 141 and 142 to electrically connect the first and second connection structures 141 and 142. For example, the first connection structure 141 may be disposed on the lower wiring layer 112, and have a first hollow 141H that is open toward the upper substrate 130, and the second connection structure 142 may be disposed below the upper wiring layer 132, and have a second hollow 142H open toward the lower substrate 110 so that the first connection structure 141 is inserted into the second connection structure 142. Here, the second hollow 142H may be configured such that a width of the second hollow 142H is greater than a width of the first hollow 141H. However, the embodiments of the inventive concept is not limited thereto. The first and second connection structures 141 and 142 may include a metal material including, for example, copper (Cu), aluminum (Al), silver (Ag), tin (Sn), gold (Au), nickel (Ni), lead (Pb), titanium (Ti), or a metal material including an alloy thereof.

Hereinafter, first and second connection structures 141 and 142 will be described in more detail with reference to FIG. 1C together.

The second connection structure 142 may be disposed below an upper wiring layer 132 or a landing pad 132P surrounded by a lowermost insulating layer 131*a*. Depending on example embodiments, the landing pad 132P may protrude below the lowermost insulating layer 131*a*. The second connection structure 142 may face the first connection structure 141 and have an inner side surface 142IS forming an inner wall of the second hollow 142H, an outer side surface 142OS opposite to the inner side surface 142IS, and a bottom surface 142BS forming a bottom of the second hollow 142H. The second connection structure 142 may include a second hollow 142H into which the first connection structure 141 is inserted, thereby preventing misalignment during a package manufacturing process.

According to the inventive concept, by improving the wettability of the conductive connection member 143 to the first connection structure 141, it is possible to prevent a non-wetting defect of the conductive connection member 143, and may prevent the conductive connection member 143 from protruding beyond the outer side surface 142OS of the second connection structure 142. In an example embodiment, the semiconductor package 100A may include a first surface layer SL1 surrounding at least a portion of the first hollow 141H of the first connection structure 141. The first surface layer SL1 may be formed along an inner wall of the first hollow 141H so that the conductive connection member 143 is filled in an inside of the first hollow 141H, and accordingly, may be in contact with the conductive connection member 143 inside the first hollow 141H. The first connection structure 141 may be disposed on the lower wiring layer 112 or a landing pad 112P surrounded by an uppermost insulating layer 111*a*. Depending on example embodiments, the landing pad 112P may protrude above the uppermost insulating layer 111*a*. The first connection structure 141 may have an outer side surface 141OS facing the second connection structure 142, an inner side surface 141IS disposed opposite to the outer side surface 141OS and forming an inner wall of a first hollow 141H, and a bottom surface 141BS forming a bottom of the first hollow 141H, and at least a portion of the conductive connection member 143 may extend along the inner surface 141IS of the first hollow 141H toward the bottom surface 141BS. The conductive connection member 143 may be filled into the first hollow 141H having the first surface layer SL1. In addition, the outer side surface 141OS of the first connection structure 141 and the inner side surface 142IS of the second connection structure 142 may be spaced apart from each other, and a conductive connection member 143 may be filled therebetween. Accordingly, in one embodiment, the conductive connection member 143 may have a first lower end LE1 adjacent to the lower substrate 110 in the first hollow 141H, and a second lower end LE2 adjacent to the lower substrate 110 outside of the first hollow 141H, wherein the first lower end LE1 may be disposed on a lower level or the same level as the second lower end LE2. For example, as a result of filling the conductive connecting member 143 to the first hollow 141H, the first lower end LE1 may be disposed closer to the lower substrate 110 than the second lower end LE2. As a result, voids, non-wet defects, and the like between the conductive connection member 143 and the first connection structure 141 may be minimized, and a short between adjacent conductive connection members 143 may be prevented. However, example embodiments of the inventive concept are not limited thereto, and the second lower end LE2 may also be disposed on a lower level than the first lower end LE1.

According to an example embodiment, the semiconductor package 100A may further include a second surface layer SL2 surrounding at least a portion of a second hollow 142H of the second connection structure 142. The second surface layer SL2 may be formed along an inner side surface 142IS of the second connection structure 142 so that the conductive connection member 143 extends along an inner wall of the second hollow 141H, and accordingly, the second surface layer SL2 may be in contact with the conductive connection member 143 inside the second hollow 142H. In addition, a solder resist layer 135 protecting the second connection structure 142 from chemical/physical damages may be formed on the outer side surface 142OS of the second connection structure 142. The solder resist layer 135 may be formed to cover a portion of a lower surface of the upper substrate 130, and a portion of a surface of the second connection structure 142, for example, the outer side surface 142OS and a lower surface 142LS thereof. The solder resist layer 135 may also prevent the conductive connection member 143 from overflowing beyond the lower surface 142LS of the second connection structure 142.

The first and second surface layers SL1 and SL2 may include a material having excellent wettability of the conductive connection member 143. For example, the conductive connection member 142 may include a low-melting point metal, for example, tin (Sn), indium (In), bismuth (Bi), antimony (Sb), copper (Cu), silver (Ag), zinc (Zn), lead (Pb) or an alloy including thereof (e.g, Sn—Ag—Cu), and the first and second surface layers SL1 and SL2 may include gold (Au) or an alloy of gold (Au). The first and second surface layers SL1 and SL2 may have a single-layer or multi-layer shape. For example, in case of a multi-layer shape, the first and second surface layers SL1 and SL2 may include a first layer including nickel (Ni) or an alloy of nickel (Ni), and a second layer including gold (Au) or an alloy of gold (Au). However, a material and shape of the first and second surface layers SL1 and SL2 are not limited thereto, and may be variously modified according to the wettability and process conditions of the conductive connection member 143.

In an example embodiment, in order to secure a joint gap H between the lower substrate 110 and the upper substrate 130, the first connection structure 141 and the first surface layer SL1 may be spaced apart from a second surface layer SL2 covering a bottom surface 142BS of the second connection structure 142. The joint gap H may have a range of about 100 μm or more, for example, about 100 μm to about 500 μm, but an example embodiment thereof is not limited thereto. The joint gap H may be formed to have a height according to design.

The encapsulant 150 may fill a space between the lower substrate 110 and the upper substrate 130, and may encapsulate at least a portion of each of the semiconductor chip 120 and the first and second connection structures 141 and 142. For example, the encapsulant 150 may have a capillary underfill (CUF) structure in which the underfill resin 151 between the semiconductor chip 120 and the upper substrate 130 is separated, but an example embodiment thereof is not limited thereto. Depending on example embodiments, the encapsulant 150 may also have a molded underfill (MUF) structure integrated with the underfill resin.

The connection bump 160 may be disposed below the lower substrate 110, and may be electrically connected to the lower wiring layer 112. The connection bump 160 may physically and/or electrically connect the semiconductor package 100A to an external device. The connection bump 160 may include a conductive material, and may have a ball, pin, or lead shape. For example, the connection bump 160 may be a solder ball. In an example, at least one passive element 170 may be disposed adjacent to the connection bump 160 and below the lower substrate 110. The passive element 170 may include, for example, a capacitor such as a Multi Layer Ceramic Capacitor (MLCC) or a Low Inductance Chip Capacitor (LICC), an inductor, beads, and the like. In one embodiment, the passive element 170 may be a land-side capacitor (LSC). However, the embodiments of the inventive concept is not limited thereto, and the passive element 170 may be a Die-Side Capacitor (DSC) mounted on the upper surface of the lower substrate 110, or an embedded-type capacitor embedded in the lower substrate 110.

Figure 2:
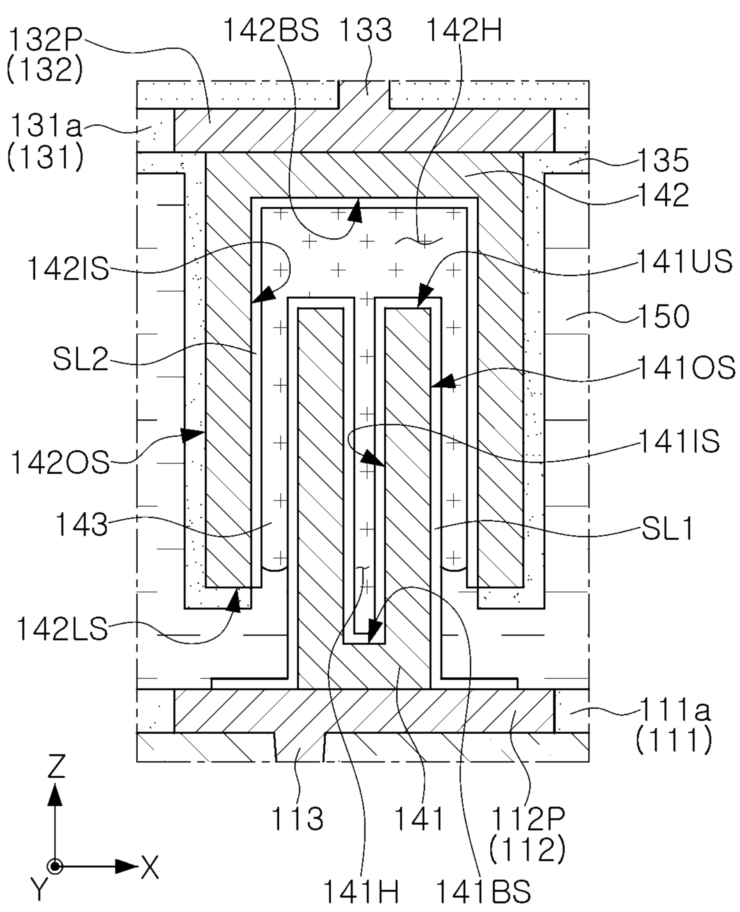
FIG. 2 is a partially enlarged view illustrating a region corresponding to FIG. 1C of a semiconductor package according to an example embodiment.

FIG. 2 is a partially enlarged view illustrating a region corresponding to FIG. 1C of a semiconductor package according to an example embodiment.

Referring to FIG. 2, a semiconductor package 100B according to an example embodiment may have the same or similar characteristics as those described with reference to FIGS. 1A to 1C, except for including a first surface layer SL1 extending to an outer side surface 141OS of a first connection structure 141. For example, the first connection structure 141 may have an outer side surface 141OS facing a second connection structure 142, an inner side surface 141IS of a second connection structure 142 disposed opposite to the outer side surface 141OS, and forming an inner wall of a first hollow 141H, and a bottom surface 141BS forming a bottom of the first hollow 141H. The first surface layer SL1 may extend along the bottom surface 141BS, the inner side surface 141IS, and the outer side surface 141OS of the first connection structure 141. According to example embodiments, the first surface layer SL1 may extend to an upper surface of a lower wiring layer 112 or a landing pad 112P. In the present example embodiment, the first surface layer SL1 may be interposed between the conductive connection member 143 and the outer side surface 141OS of the first connection structure 141, thereby further improving wettability of the conductive connection member 143, and securing connection reliability between the first and second connection structures 141 and 142.

Figure 3:
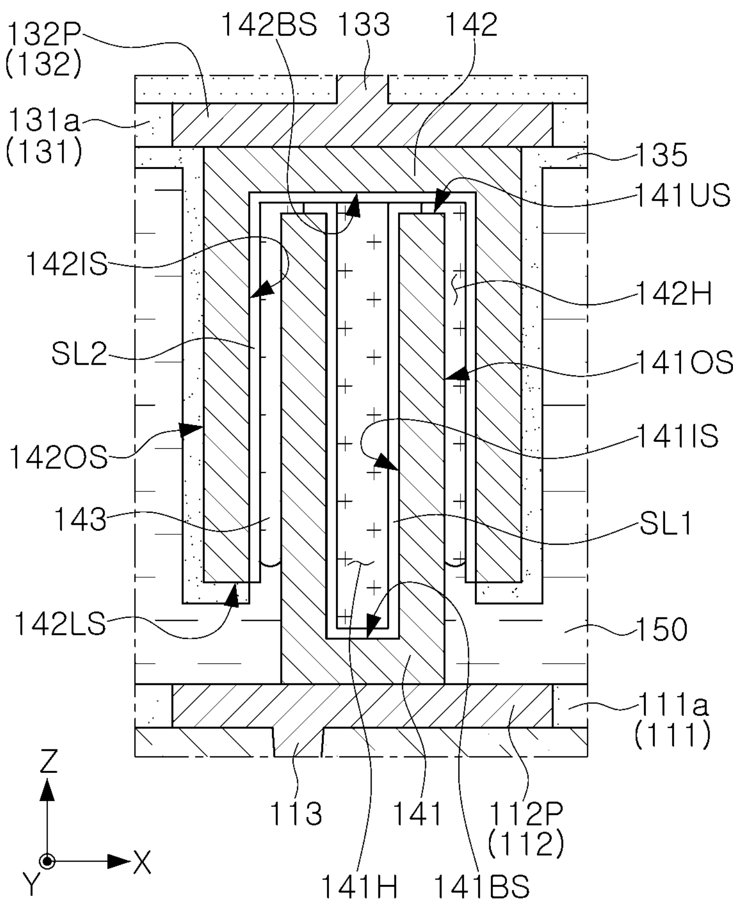
FIG. 3 is a partially enlarged view illustrating a region corresponding to FIG. 1C of a semiconductor package according to an example embodiment.

FIG. 3 is a partially enlarged view illustrating a region corresponding to FIG. 1C of a semiconductor package according to an example embodiment.

Referring to FIG. 3, a semiconductor package 100C according to an example embodiment may have the same or similar characteristics as those described with reference to FIGS. 1A to 2, except that an upper end of the first connection structure 141 is in contact with a bottom surface 142BS of a second hollow 142H. For example, a first surface layer SL1 covering the first connection structure 141 or an upper surface 141US of the first connection structure 141 may be in contact with a bottom surface 142BS of the second connection structure 142 or a portion of a second surface layer SL2 covering the inner surface of the second connection structure 142. In this structure, in a reflow process of the conductive connection member 143, a molding process of forming the encapsulant 150, or the like, a joint gap between the lower substrate 110 and the upper substrate 130 ('H' in FIG. 1C) can be effectively maintained. Also in the present example embodiment, since the first surface layer SL1 is disposed on the inner wall of the first hollow 141H of the first connection structure 141, the conductive connection member 143 may be filled in a deep portion of the first hollow 141H before the first connection structure 141 or the first surface layer SL1 is in contact with a bottom surface BS of the second connection structure 142 or the second surface layer SL2.

Figure 4:
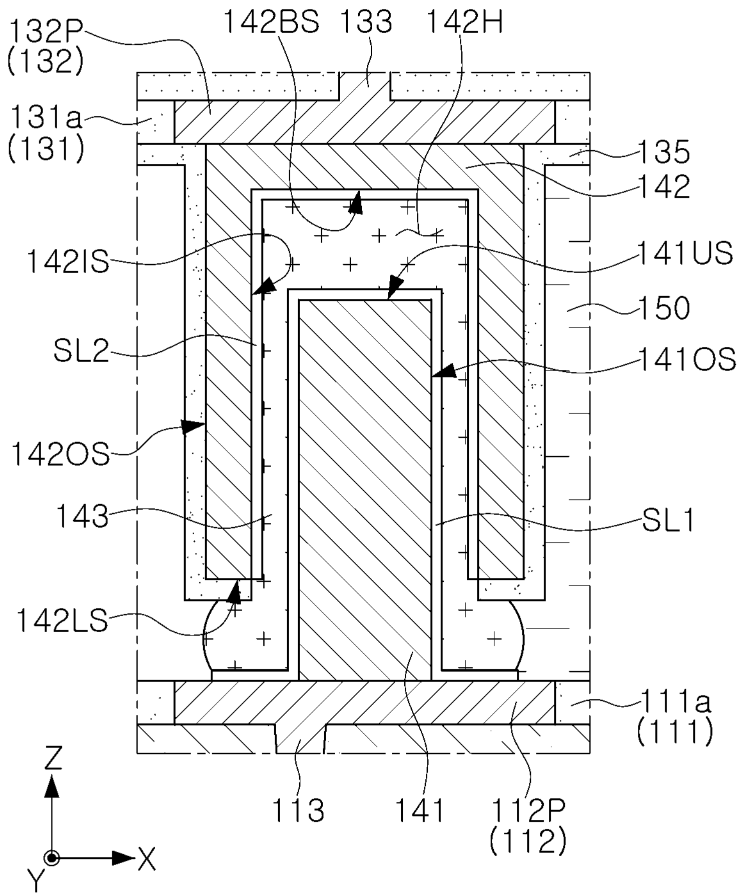
FIG. 4 is a partially enlarged view illustrating a region corresponding to FIG. 1C of a semiconductor package according to an example embodiment.

FIG. 4 is a partially enlarged view illustrating a region corresponding to FIG. 1C of a semiconductor package according to an example embodiment.

Referring to FIG. 4, a semiconductor package 100D according to an example embodiment may have the same or similar characteristics as those described with reference to FIGS. 1A to 3, except that the first connection structure 141 has a post shape without a hollow. For example, the semiconductor package 100D according to an example embodiment may include a first connection structure 141 disposed on the lower wiring layer 112, and protruding toward the upper substrate 130, a second connection structure 142 disposed below the upper wiring layer 132, and protruding toward the lower substrate 110 to surround the first connection structure 141, and a first surface layer SL1 covering at least a portion of a surface of the first connection structure 141. The conductive connection member 143 may extend along the first surface layer SL1 between the first and second connection structures 141 and 142. In an example embodiment, the conductive connection member 143 may be formed to protrude outwardly. Specifically, the conductive connection member 143 may be formed such that the conductive connection member 143 protrudes outwardly between an inner side surface 1421S of the second connection structure 142 and an outer surface of the first connection structure 141. In this embodiment, the first connection structure 141 may not have a hollow, so the conductive connection member 143 disposed along the outer side surface 141OS of the first connection structure 141 may be relatively large compared to the example embodiments of FIGS. 1C to 3. However, the present example embodiment is not limited thereto, and by adjusting an amount of dotting of the conductive connection member 143, the conductive connection member 143 may be variously formed between the inner side surface 142IS of the second connection structure 142 and the outer side surface 141OS of the first connection structure 141.

Figure 5A:
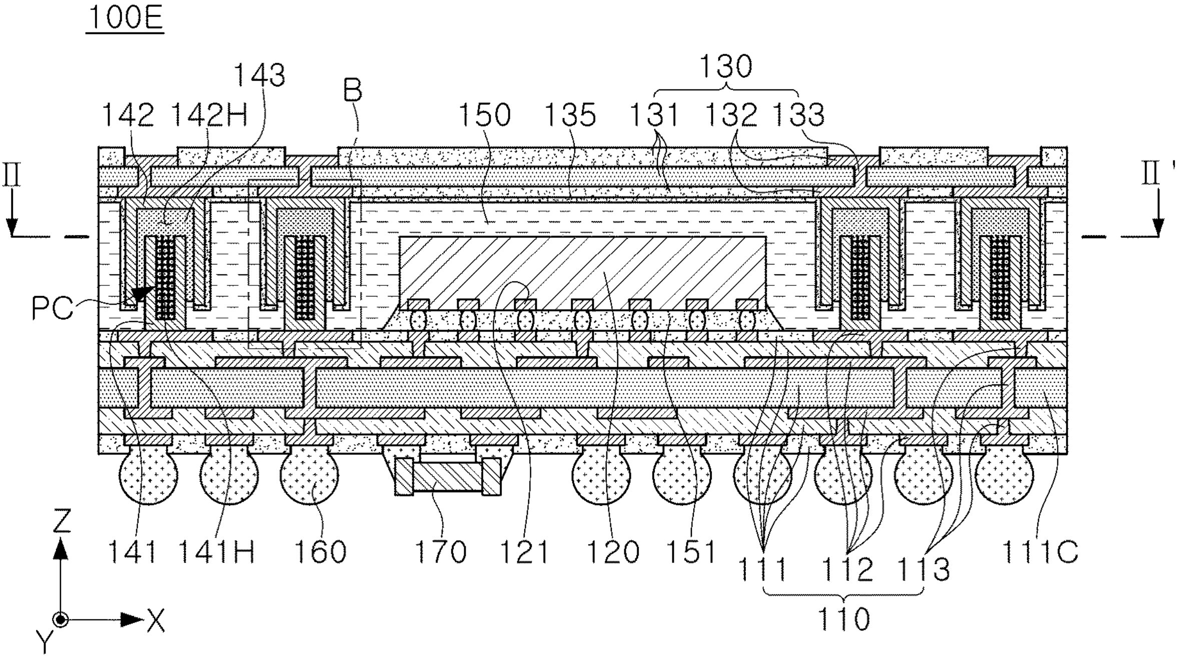
FIG. 5A is a cross-sectional view illustrating a semiconductor package according to an example embodiment.
Figure 5B:
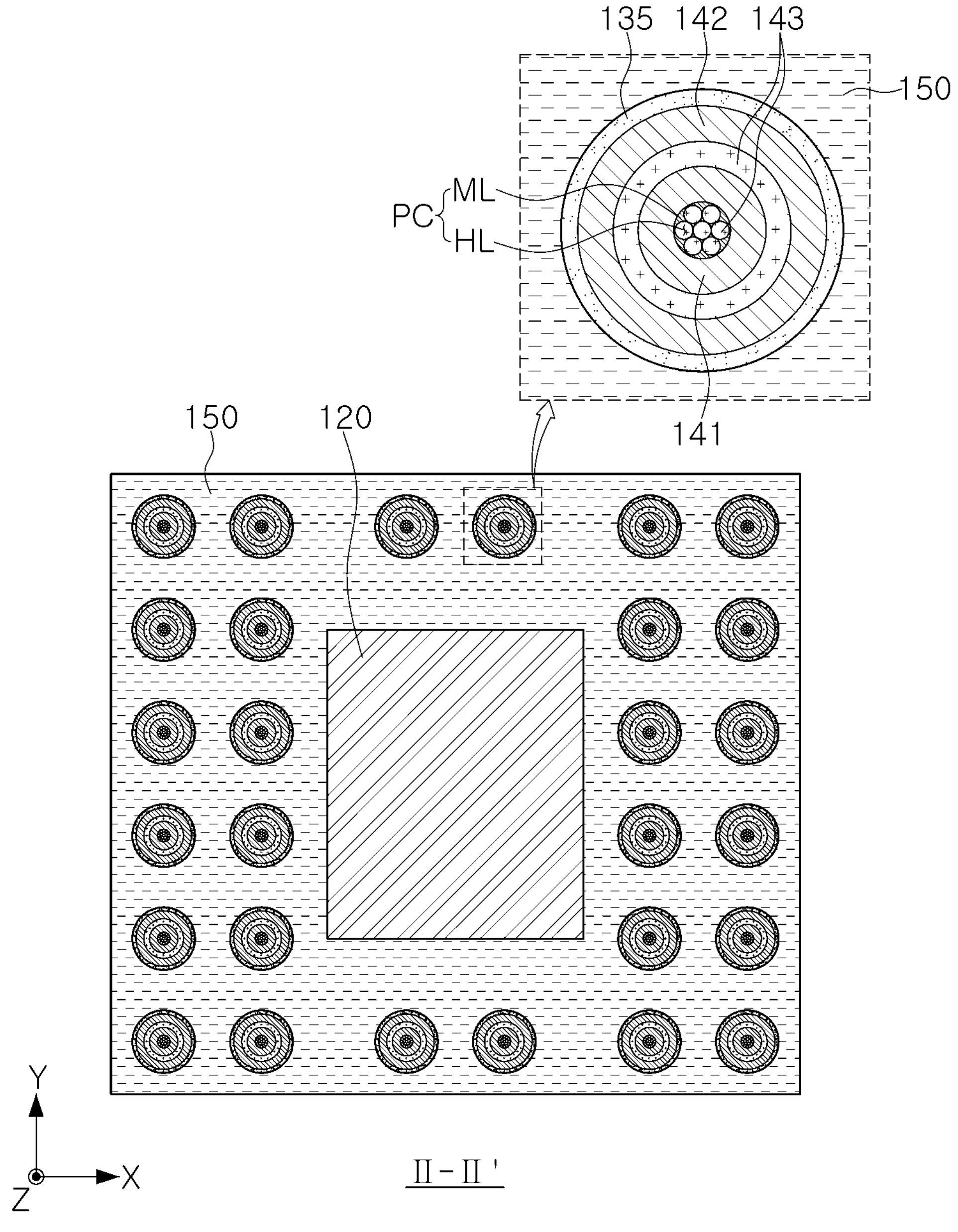
FIG. 5B is a plan view illustrating a cross-section taken along a line II-II' of FIG. 5A.
Figure 5C:
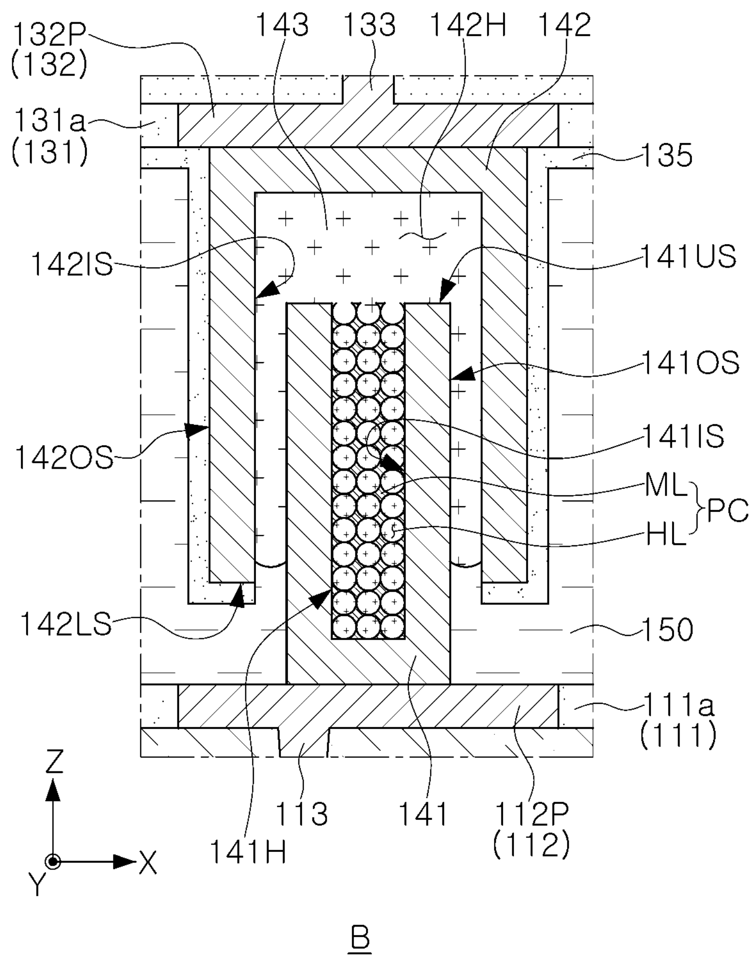
FIG. 5C is a partially enlarged view illustrating a region 'B' of FIG. 5A.

FIG. 5A is a cross-sectional view illustrating a semiconductor package 100E according to an example embodiment, FIG. 5B is a plan view illustrating a cross-section taken along line II-II' of FIG. 5A, and FIG. 5C is a partially enlarged view illustrating region 'B' of FIG. 5A.

Referring to FIGS. 5A to 5C, a semiconductor package 100E according to an example embodiment may include a porous conductive layer PC disposed inside a first hollow 141H of the first connection structure 141, and may have the same or similar characteristics as those described with reference to FIGS. 1A to 3, except that the conductive connection member 143 is filled inside the porous conductive layer PC. The porous conductive layer PC according to an example embodiment may include a plurality of holes HL formed in a metal layer ML filling the first hollow 141H, and at least a portion of the plurality of holes HL may be connected to each other. The second connection structure 142 may have a second hollow 142H into which the first connection structure 141 is inserted. A conductive connection member 143 may be disposed inside the second hollow 142H, and the conductive connection member 143 may extend into the porous conductive layer PC. As shown in FIG. 5C, a second surface layer ('SL2' in FIG. 1C) may not be disposed on an inner wall of the second hollow 142H, but the example embodiment is not limited thereto. From a similar point of view, the second surface layer SL2 of FIGS. 1A to 4 may be omitted in some example embodiments. A metal layer ML may surround the plurality of holes HL in an interior of the first hollow 141H, and may include a metal material similar to that of the first connection structure 141, for example, copper (Cu) or an alloy of copper (Cu). The plurality of holes HL may have a size such that the conductive connection member 143 may be filled in a deep portion of the first hollow 141H by inducing a capillary action. For example, the plurality of holes HL may have a diameter in a range from about 0.01 μm to 10 μm. The porous conductive layer PC may induce the conductive connecting member 143 to be filled in the deep portion of the first hollow 141H without a surface layer inside the first hollow 141H. A method of forming the porous conductive layer PC will be described later with reference to FIGS. 10A to 10C.

Figure 6:
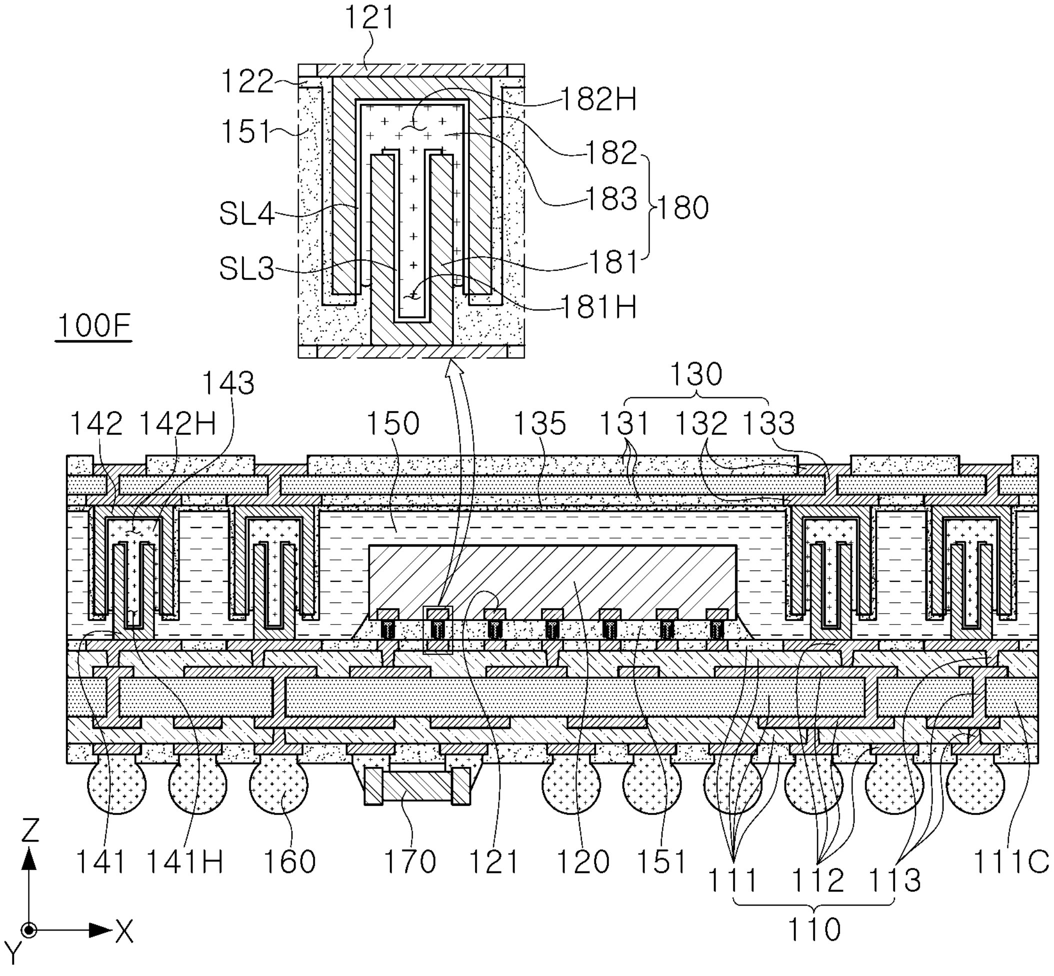
FIG. 6 is a cross-sectional view illustrating a semiconductor package according to an example embodiment.

FIG. 6 is a cross-sectional view illustrating a semiconductor package according to an example embodiment.

Referring to FIG. 6, a semiconductor package 100F according to an example embodiment may have the same or similar characteristics as those described with reference to FIGS. 1A to 5C, except that the semiconductor package 100F further includes a bump structure 180 disposed between the lower substrate 110 and the semiconductor chip 120, and electrically connecting the connection pad 121 of the semiconductor chip 120 to the lower wiring layer 112. The bump structure 180 may be disposed on the lower wiring layer 112, and may include a third connection structure 181 having a third hollow 181H open toward the semiconductor chip 120, a fourth connection member 182 disposed below the connection pad 121. The fourth connection member 182 may have a fourth hollow 182H open toward the lower substrate 110 into which the third connection structure 181 is inserted, and a second conductive member (or 'a connection member') 183 filling at least a portion of each of the third and fourth hollows 181H and 182H. The bump structure 180 may prevent misalignment between the semiconductor chip 120 and the lower substrate 110 and improve wettability of the connection member 183 to minimize defects such as voids and non-wetting.

Figure 7:
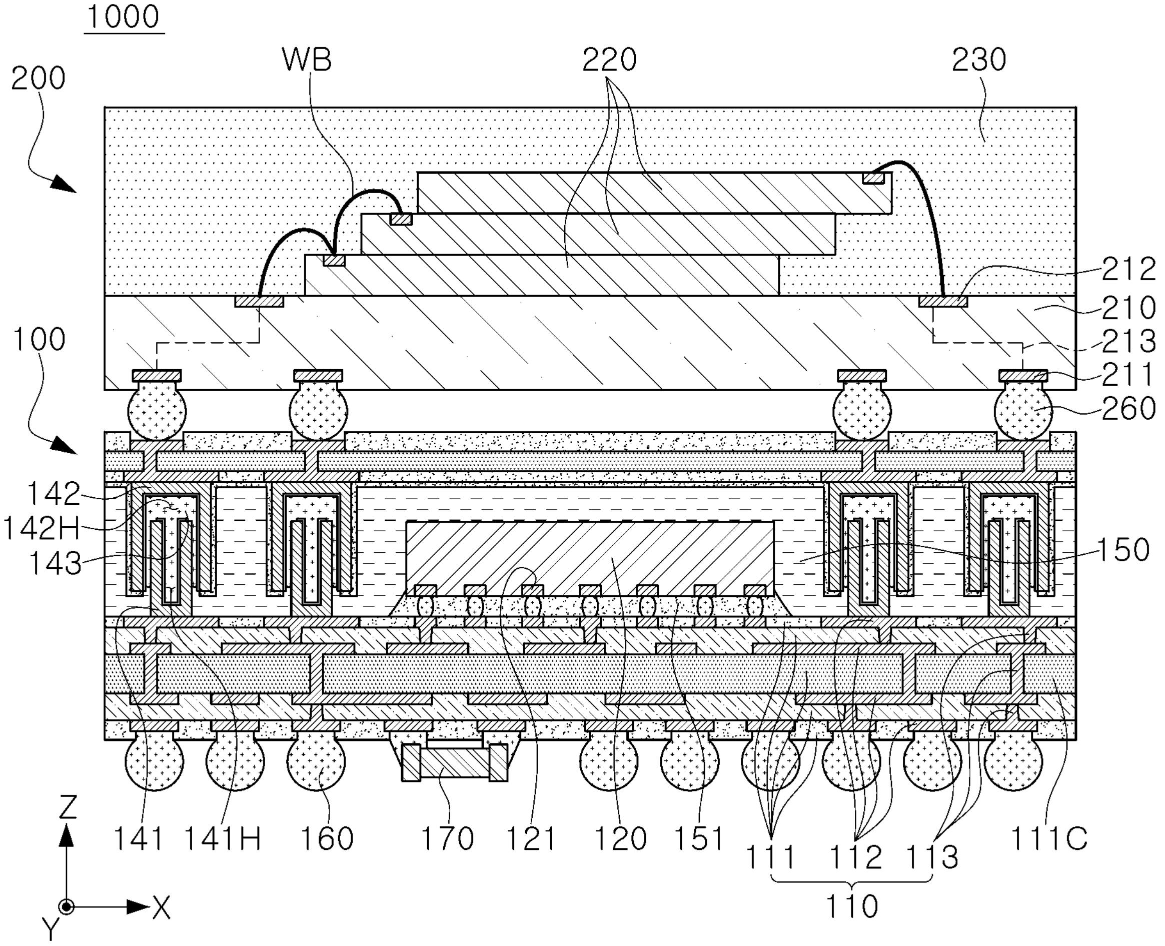
FIG. 7 is a cross-sectional view illustrating a semiconductor package according to an example embodiment.

FIG. 7 is a cross-sectional view illustrating a semiconductor package 1000 according to an example embodiment.

Referring to FIG. 7, a semiconductor package 1000 according to an example embodiment may include a first package 100 and a second package 200. The first package 100 may correspond to the semiconductor package 100A illustrated in FIGS. 1A and 1C, but it should be understood that the first package 100 may have the same or similar characteristics as the semiconductor packages 100A, 100B, 100C, 100D, 100E, and 100F described with reference to FIGS. 1A to 6.

A second package 200 may include a redistribution substrate 210, a second semiconductor chip 220, and a second encapsulant 230. The redistribution substrate 210 may include a lower pad 211 on a lower surface of the redistribution substrate 210 and an upper pad 212 on an upper surface of the redistribution substrate 210. Each of the lower pad 211 and the upper pad 212 may be electrically connected to external elements. In addition, the redistribution substrate 210 may include a redistribution circuit 213 for electrically connecting the lower pad 211 and the upper pad 212.

The second semiconductor chip 220 may be mounted on the redistribution substrate 210 by wire bonding or flip-chip bonding. For example, the plurality of second semiconductor chips 220 may be vertically stacked on the redistribution substrate 210, and electrically connected to the upper pad 212 of the redistribution substrate 210 by a bonding wire WB. In an example, the second semiconductor chip 220 may include a memory chip, and the first semiconductor chip 120 may include an AP chip.

The second encapsulant 230 may include the same or similar material to the encapsulant 150 of the first package 100. The second package 200 may be physically and electrically connected to the first package 100 by a metal bump 260. The metal bump 260 may be electrically connected to a redistribution circuit 213 inside the redistribution substrate 210 through the lower pad 211 of the redistribution substrate 210. The metal bump 260 may include a low melting point metal, for example, tin (Sn) or an alloy including tin (Sn). The semiconductor package 1000 according to the present example embodiment may include the first package 100 having improved reliability, and may be implemented as a package-on-package structure having excellent reliability.

FIGS. 8A to 8F are partially enlarged views illustrating a manufacturing process of the second connection structure 142 of FIG. 1C according to an example embodiment. FIGS. 8A to 8F illustrate a manufacturing process of the second connection structure 142 and a solder resist layer 135 covering an outside and inside of the second connection structure 142 and a second surface layer SL2.

Figure 8A:
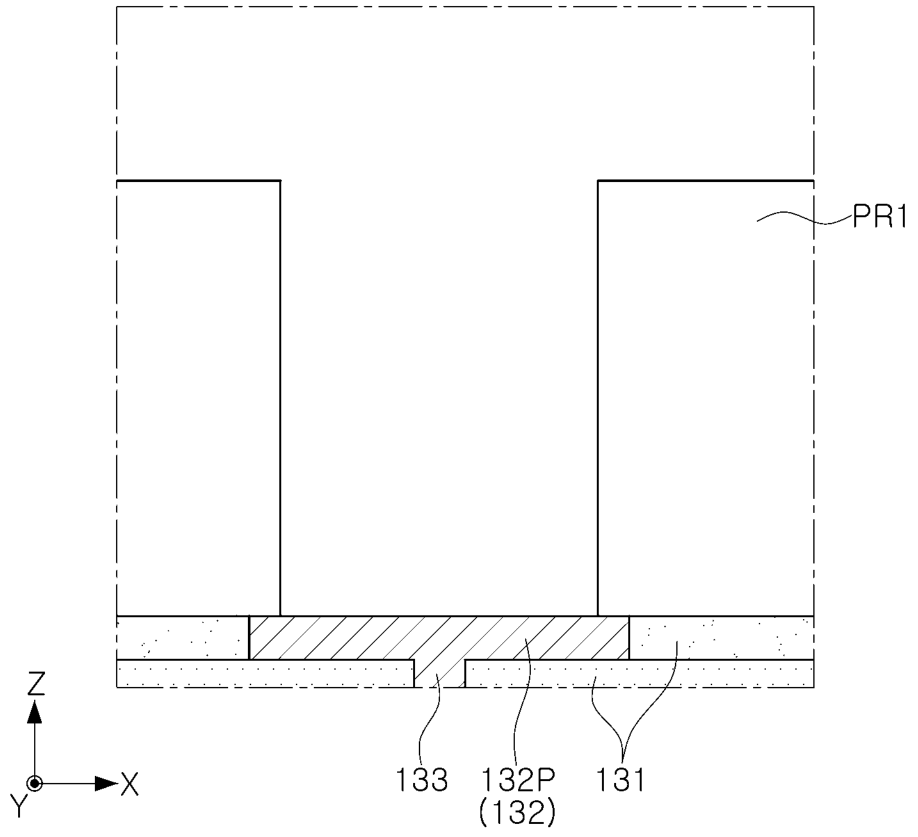
FIGS. 8A to 8F are partially enlarged views illustrating a manufacturing process of the second connection structure of FIG. 1C according to an example embodiment.

Referring to FIG. 8A, a patterned first photosensitive material layer PR1 may be formed on a landing pad 132P of an upper wiring layer 132. The landing pad 132P may be provided with a side surface surrounded by the insulating layer 131, but according to an example embodiment, the landing pad 132P may protrude from a surface of the insulating layer 131. The first photosensitive material layer PR1 may be formed by coating and curing a photosensitive material. The photosensitive material may include, for example, a photoresist. The first photosensitive material layer PR1 may be patterned using a photolithography process.

Figure 8B:
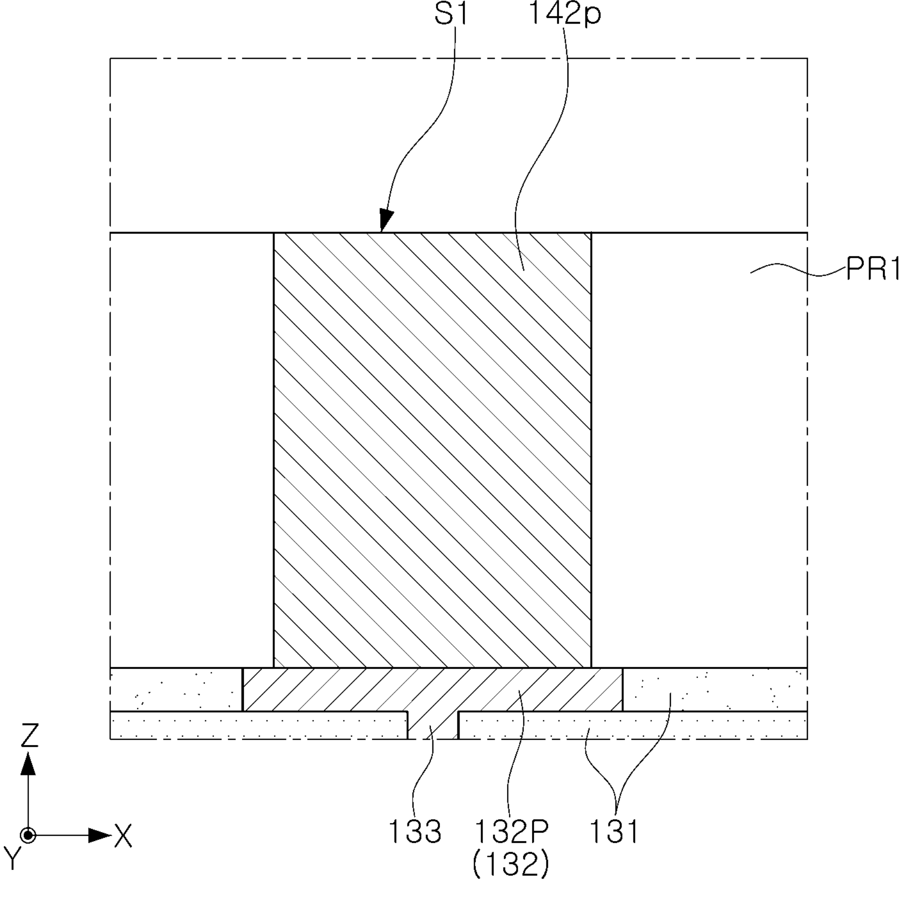

Referring to FIG. 8B, a preliminary connection structure 142*p* may be formed in the patterned first photosensitive material layer PR1. The preliminary connection structure 142*p* may be formed by filling a metal material, for example, copper (Cu) or an alloy of copper (Cu) using an electroplating process using the landing pad 132P as a seed layer, for example, Semi Additive Process (SAP), Modified Semi Additive Process (MSAP), or the like, in the first photosensitive material layer PR1. An upper surface S1 of the preliminary connection structure 142*p* may be planarized by a chemical mechanical planarization (CMP) process, or the like.

Figure 8C:
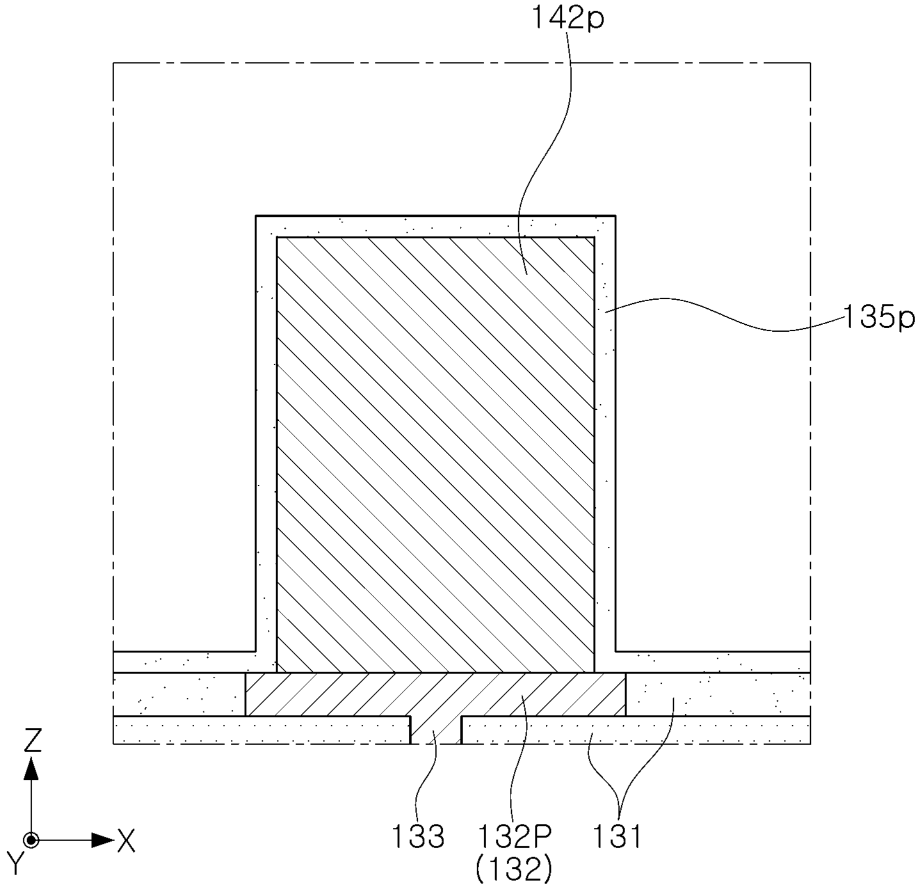

Referring to FIG. 8C, a preliminary solder resist layer 135*p* covering a surface of the preliminary connection structure 142*p* may be formed. The preliminary solder resist layer 135*p* may be formed by, for example, applying and curing photo solder resist (PSR) ink on the surface of the preliminary connection structure 142*p*. The preliminary solder resist layer 135*p* may be formed to extend to surfaces of the upper wiring layer 132 and the insulating layer 131. However, in some example embodiments, a process of forming the preliminary solder resist layer 135*p* may be omitted. For example, in the case of the first connection structure 141 of FIG. 1C, a process of forming the preliminary solder resist layer 135*p* may be omitted so that an outer side surface of the first connection structure 141 is exposed.

Figure 8D:
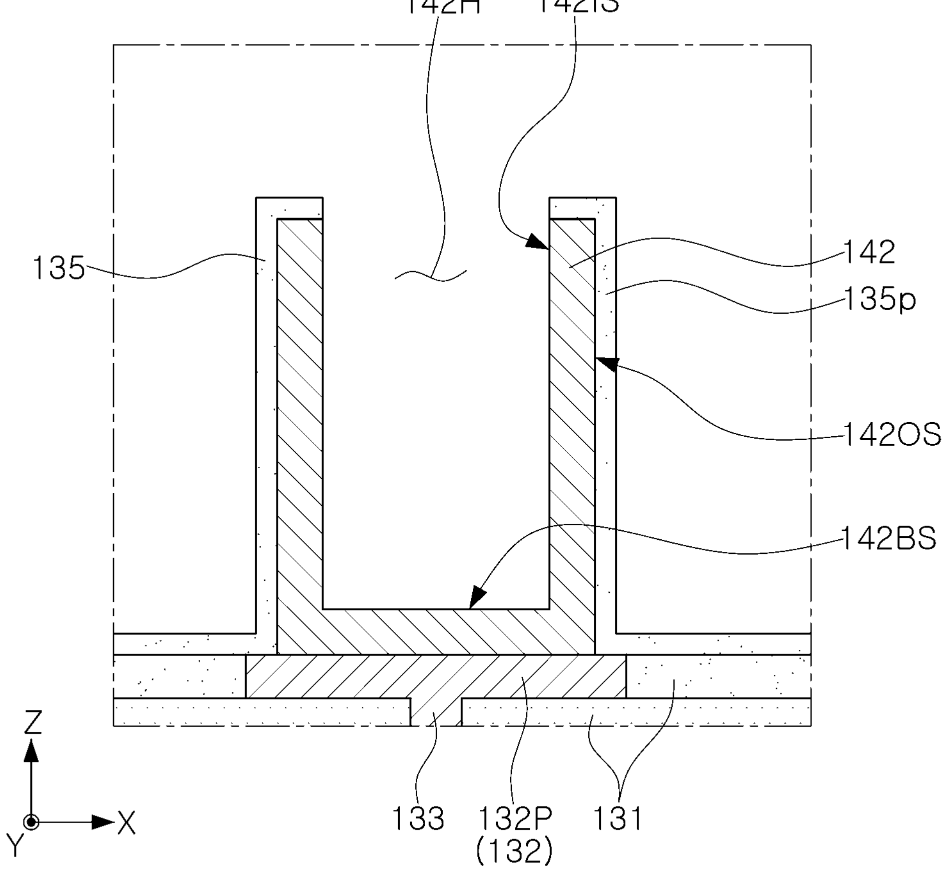

Referring to FIG. 8D, a second connection structure 142 and a second hollow 142H may be formed. The second connection structure 142 and the second hollow 142H may be formed by removing a portion of the preliminary solder resist layer 135*p* and the preliminary connection structure 142*p* of FIG. 8C using a laser drill or the like. Accordingly, the second connection structure 142 may have a bottom surface 142BS that is not covered by the solder resist layer 135 and an inner side surface 142IS. In a process of forming the second hollow 142H, a portion of the preliminary solder resist layer 135*p* of FIG. 8C may be removed to form a solder resist layer 135.

Figure 8E:
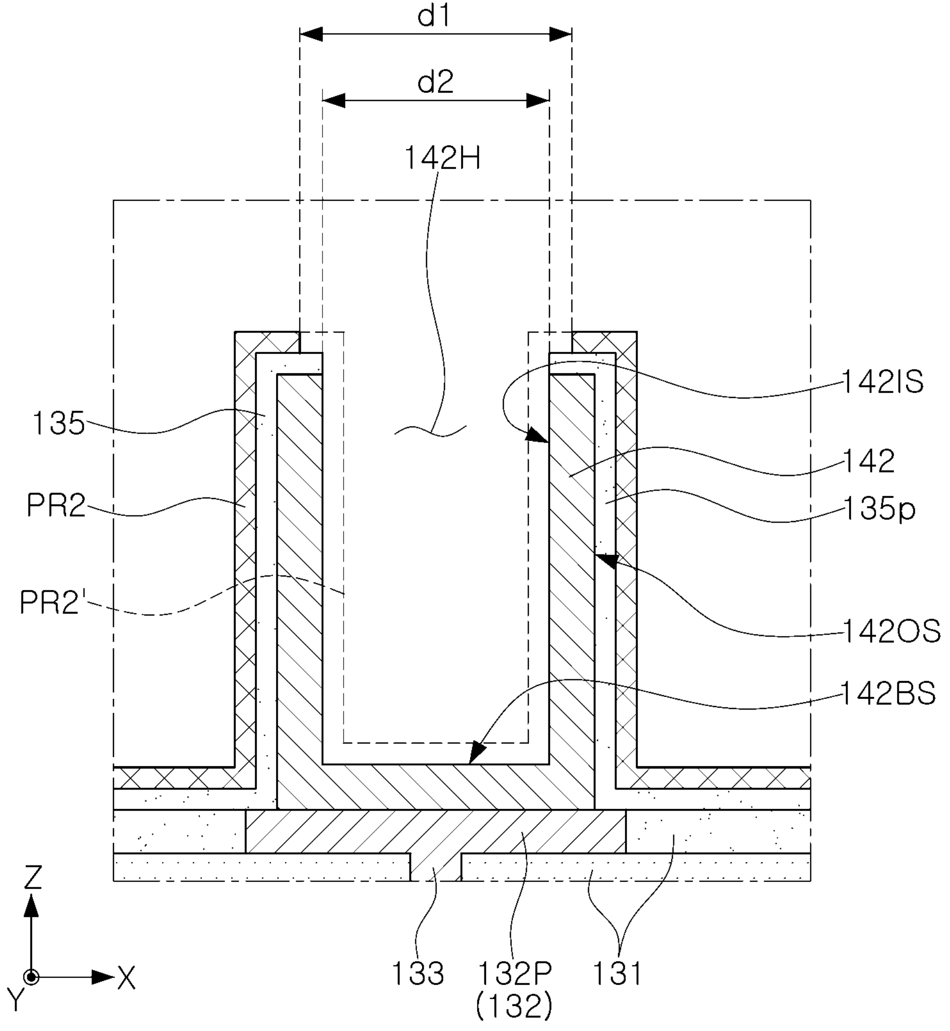

Referring to FIG. 8E, a patterned second photosensitive material layer PR2 may be formed to expose the second hollow 142H. The second photosensitive material layer PR2 may be formed using, for example, a photosensitive material such as a photoresist, or the like. The second photosensitive material layer PR2 may have a pattern region PR2' to which the second connection structure 142 is exposed. For example, in order to secure a process margin, a width d1 of a pattern region PR2' may be greater than a width d2 of the second hollow 142H. The second photosensitive material layer PR2 may be formed along a surface of the solder resist layer 135, and may serve to limit a formation region of a second surface layer ('SL2' in FIG. 8F).

Figure 8F:
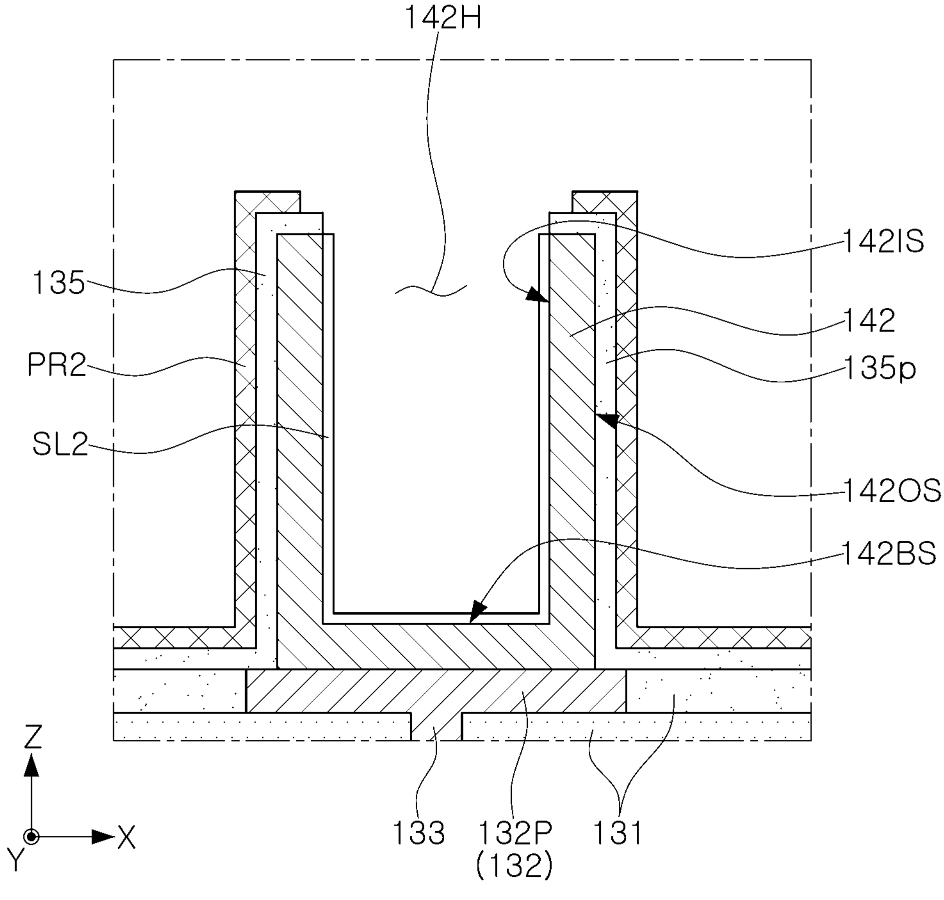

Referring to FIG. 8F, a second surface layer SL2 extending along an inner wall of the second hollow 142H may be formed. The second surface layer SL2 may be formed, for example, by an electroless plating process using the second connection structure 142 as a seed layer. The second surface layer SL2 may be formed along a bottom surface 142BS and an inner side surface 142IS of the second connection structure 142. According to an example embodiment, the second surface layer SL2 may be conformally formed along the bottom surface 142BS and the inner side surface 142IS of the second connection structure 142, and may include a first layer including nickel (Ni) or an alloy of nickel (Ni), and a second layer formed on the first layer and including gold (Au) or an alloy of gold (Au).

It should be understood that the second connection structure 142 of FIG. 1C is manufactured through the above-described process, and the connection structures illustrated in FIGS. 2 to 6 may also be manufactured by slightly modifying or omitting some of the processes described above. For example, when the preliminary solder resist layer 135*p* of FIG. 8C is omitted, the first connection structure 141 of FIG. 1C may be manufactured, and a width of a pattern region PR2' of the second photosensitive material layer PR2 of FIG. 8E may be adjusted to form the first connection structure 141 of FIG. 2.

Figure 9A:
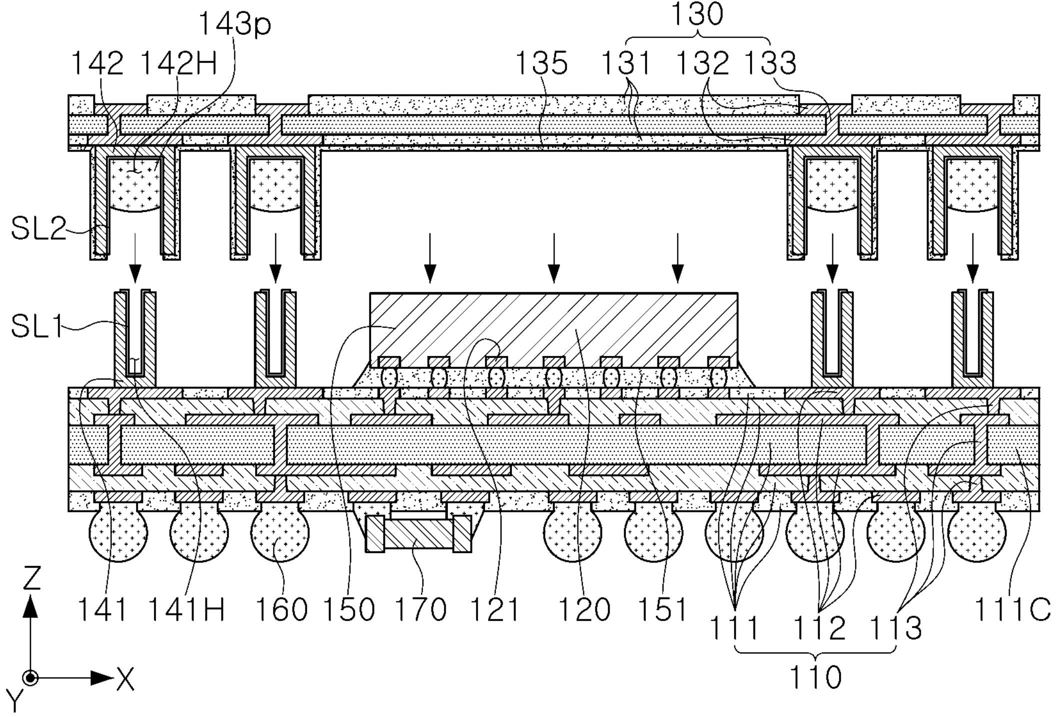
FIGS. 9A and 9B are cross-sectional views illustrating a coupling process of the first and second connection structures of the semiconductor package of FIG. 1A and a conductive connection member according to example embodiments.
Figure 9B:
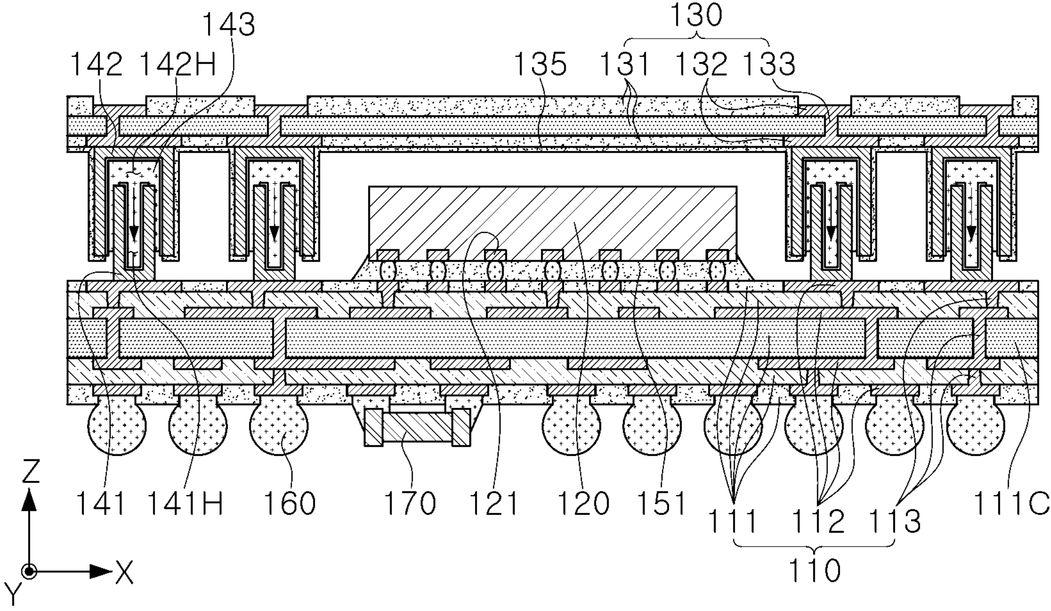

FIGS. 9A and 9B are cross-sectional views illustrating a coupling process of the first and second connection structures 141 and 142 and the conductive connection member 143 of the semiconductor package of FIG. 1A.

Referring to FIG. 9A, a lower substrate 110 and an upper substrate 130 on which the first connection structure 141 and the second connection structure 142 manufactured through the process of FIGS. 8A to 8F are respectively disposed may be coupled to each other. The lower substrate 110 and the upper substrate 130 may be coupled such that the first connection structure 141 is inserted into the second connection structure 142. According to an embodiment, the shapes of the first connection structure 141 and the second connection structure 142 may be configured such that the second connection structure 142 can be inserted into the first connection structure 141. The shapes of the first connection structure 141 and the second connection structure 142 are not limited to those shown in the accompanying drawings, but may be variously configured. A first surface layer SL1 may be disposed inside a first hollow 141H of the first connection structure 141. A preliminary conductive connection member 143*p* may be disposed on an inner surface of a second hollow 142H of the second connection structure 142. After the first connection structure 141 is inserted into the second hollow 142H, the preliminary conductive connection member 143*p* may be dotted in an appropriate amount so as to not overflow outwardly from the second connection structure 142. According to an embodiment, a second surface layer SL2 may be disposed inside the second hollow 142H of the second connection structure 142. In FIG. 9A, the lower substrate 110 is illustrated such that the connection bump 160 and the passive element 170 attached thereto, but according to an example embodiment, the upper substrate 130 may be coupled to the connection bump 160 and the passive element 170 and a molding process may be performed thereto so that the connection bump 160 and the passive element 170 are disposed on the upper substrate 130.

Referring to FIG. 9B, a first connection structure 141 may be inserted into a second connection structure 142 to secure a joint gap. The first connection structure 141 may press a conductive connection member 143 inside the second hollow 142H so that the conductive connection member 143 flows toward the lower substrate 110. The conductive connection member 143 may be filled in a deep portion of the first hollow 141H along the first surface layer ('SL1' in FIG. 9A) inside the first hollow 141H. Accordingly, a first lower end of the conductive connection member 143 inside the first hollow 141H may be arranged closer to the lower substrate 110 than a second lower end outside of the first hollow 141H. As described above, according to the inventive concept, misalignment of the lower substrate 110 and the upper substrate 130 can be prevented through an insertion structure of the first and second connection structures 141 and 142, and by improving the wettability of the conductive connection member 143 to the first connection structure 141, it is possible to prevent a non-wetting defect of the conductive connection member 143 or the conductive connection member 143 from excessively protruding from an outer side surface of the second connection structure 142.

Figure 10A:
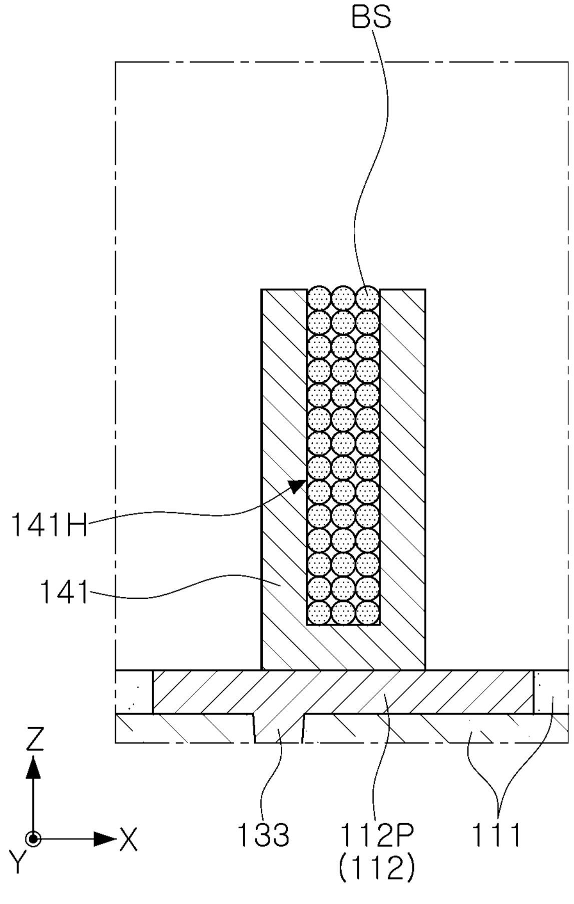
FIGS. 10A to 10C are partially enlarged views illustrating a manufacturing process of the first connection structure of FIG. 5C according an example embodiment.
Figure 10B:
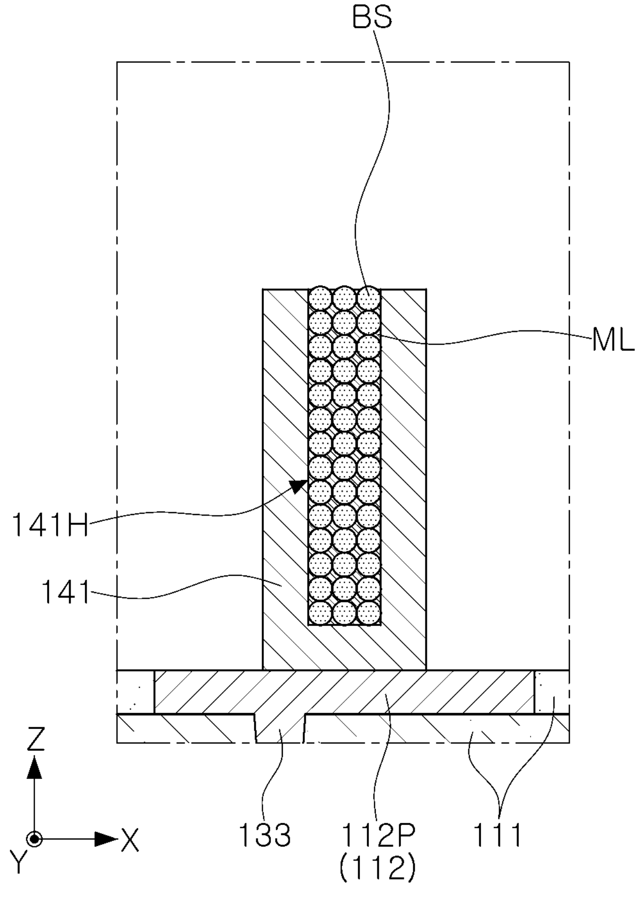
Figure 10C:
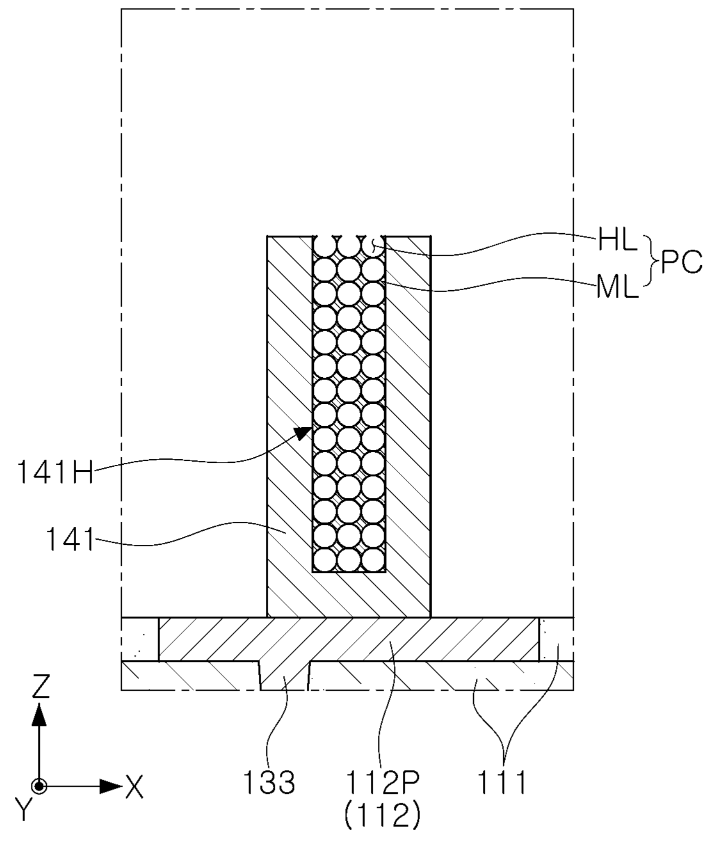

FIGS. 10A to 10C are partially enlarged views illustrating a manufacturing process of the first connection structure 141 of FIG. 5C according to an embodiment. FIGS. 10A to 10C illustrate only some manufacturing processes of the porous conductive layer PC of FIG. 5C.

Referring to FIG. 10A, a plurality of ball structures BS may be disposed in a first hollow 141H of a first connection structure 141 formed through the manufacturing process of FIGS. 8A, 8B and 8D. The plurality of ball structures BS may be formed of a metal material forming the first connection structure 141, for example, copper (Cu) and a material having etch selectivity. The plurality of ball structures BS may include a polymer sphere, for example, a polystyrene sphere (PS). For example, the plurality of ball structures BS may be filled in the first hollow 141H in a form of a slurry, and may be uniformly aligned through a baking process.

Referring to FIG. 10B, a metal layer ML filling space between the plurality of ball structures BS may be formed through an electroless plating or electroplating process using the first connection structure 141 as a seed layer. Since the plurality of ball structures BS have a spherical shape, it may be understood that a space between the plurality of ball structures BS are connected to each other in a region. In addition, a resist layer (e.g., 'P2' in FIG. 8F) for limiting a formation region of the metal layer ML may be disposed on an outer side surface and an upper surface of the first connection structure 141.

Referring to FIG. 10C, an etching process may be performed to form a porous conductive layer PC including a metal layer ML and a plurality of holes HL. The plurality of holes HL may be formed by, for example, removing the plurality of ball structures BS of FIG. 10B through a wet etching process. Accordingly, the plurality of holes HL may be connected to each other in the contact region of the plurality of ball structures BS of FIG. 10B and may have a diameter of about 10 μm or less to induce a capillary phenomenon.

As set forth above, according to example embodiments of the inventive concept, by introducing a pair of connection structures having improved wettability of a conductive connection member, a semiconductor package in which misalignment of a lower substrate and an upper substrate is prevented and reliability is improved may be provided.

Herein, a lower side, a lower portion, a lower surface, and the like, are used to refer to a direction toward a mounting surface of the fan-out semiconductor package in relation to cross-sections of the drawings, and an upper side, an upper portion, an upper surface, and the like are used to refer to an opposite direction to the direction toward the mounting surface. However, these directions are explained for convenience of explanation, and the claims are not particularly limited by the directions described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. That is, the terms such as "first", "second" and the like may be used only to distinguish one element from another element, and may not limit the sequence or importance of the elements. In some cases, a first element may be referred to as a second element and similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless specifically indicated otherwise. Also, singular forms may include plural forms unless specifically indicated otherwise.

Terms used herein are used in order to describe example embodiments of the disclosure, and it should be understood that these terms are not intended to limit the scope of the disclosure.

While example embodiments have been shown and described above, it will be apparent to those skilled in the art that modifications and variations could be made without departing from the scope of the inventive concept as defined in the appended claims.

What is claimed is:

1. A semiconductor package, comprising:

a lower substrate including a lower wiring layer;

a semiconductor chip disposed on the lower substrate, and electrically connected to the lower wiring layer;

an upper substrate disposed on the semiconductor chip, and including an upper wiring layer;

a first connection structure disposed on the lower wiring layer, and having a first hollow open toward the upper substrate;

a second connection structure disposed below the upper wiring layer, and having a second hollow open toward the lower substrate;

a conductive connection member disposed between the first connection structure and the second connection structure, and filling at least a portion of the first hollow; and an encapsulant disposed between the lower substrate and the upper substrate, and encapsulating at least a portion of each of the semiconductor chip, the first connection structure and the second connection structure, wherein the first connection structure is inserted into the second connection structure, wherein the conductive connection member has a first lower end in the first hollow, and a second lower end adjacent to the lower substrate outside of the first hollow, and wherein the first lower end is disposed on a lower level or the same level as the second lower end.

2. The semiconductor package of claim 1, wherein the first lower end is disposed closer to the lower substrate than the second lower end.

3. The semiconductor package of claim 1, further comprising:

a first surface layer disposed on at least a portion of the first hollow, and in contact with the conductive connection member; and a second surface layer disposed on at least a portion of the second hollow, and in contact with the conductive connection member.

4. The semiconductor package of claim 3, wherein the first surface layer and the second surface layer comprise gold (Au) or an alloy of the gold (Au), and wherein the conductive connection member comprises tin (Sn) or an alloy including the tin (Sn).

5. The semiconductor package of claim 1, wherein the first connection structure comprises a porous conductive layer disposed in the first hollow, and wherein the conductive connection member is filled in an interior of the porous conductive layer.

6. The semiconductor package of claim 5, wherein the porous conductive layer comprises a plurality of holes formed in a metal layer filling the first hollow, and wherein some of the plurality of holes are connected to each other.

7. The semiconductor package of claim 6, wherein the metal layer and the first connection structure comprise copper (Cu) or an alloy including the copper (Cu).

8. A semiconductor package, comprising:

a lower substrate including a lower wiring layer;

a semiconductor chip disposed on the lower substrate, and electrically connected to the lower wiring layer;

an upper substrate disposed on the semiconductor chip, and including an upper wiring layer;

a first connection structure disposed on the lower wiring layer, and having a first hollow open toward the upper substrate;

a second connection structure disposed below the upper wiring layer, and having a second hollow open toward the lower substrate;

a conductive connection member disposed between the first connection structure and the second connection structure, and filling at least a portion of the first hollow;

a first surface layer disposed on at least a portion of the first hollow, and in contact with the conductive connection member; and an encapsulant disposed between the lower substrate and the upper substrate, and encapsulating at least a portion of each of the semiconductor chip, the first connection structure and the second connection structure, wherein the first connection structure is accommodated within the second hollow of the second connection structure, wherein the first connection structure has an inner surface defining an inner wall of the first hollow, and a bottom surface defining a bottom of the first hollow, wherein the first surface layer covers the inner surface and the bottom surface of the first connection structure, wherein the conductive connection member fills the first hollow of the first connection structure along the first surface layer, and wherein the conductive connection member comprises a first lower end in the first hollow, and a second lower end outside of the first hollow, and the first lower end is a same distance as the second lower end to the lower substrate or closer than the second lower end to the lower substrate.

9. The semiconductor package of claim 8, wherein the second connection structure has an inner side surface facing the first connection structure and forming an inner wall of the second hollow, and an outer side surface disposed opposite to the inner side surface, and wherein the inner side surface is spaced apart from the first connection structure.

10. The semiconductor package of claim 9, wherein the conductive connection member is filled between the inner side surface of the second connection structure and the first connection structure.

11. The semiconductor package of claim 8, wherein the second connection structure has an inner side surface facing the first connection structure and forming an inner wall of the second hollow, and an outer side surface disposed opposite to the inner side surface, and wherein the semiconductor package further comprises a solder resist layer disposed on a surface of the upper substrate and the outer side surface of the second connection structure.

12. The semiconductor package of claim 8, further comprising a second surface layer disposed on at least a portion of the second hollow of the second connection structure, and in contact with the conductive connection member.

13. The semiconductor package of claim 12, wherein the second connection structure has an inner side surface facing the first connection structure and forming an inner wall of the second hollow, and a bottom surface forming a bottom of the second hollow, and wherein the first surface layer of the first connection structure is in contact with the second surface layer covering the bottom surface of the second hollow.

14. The semiconductor package of claim 12, wherein the second connection structure has an inner side surface facing the first connection structure and forming an inner wall of the second hollow, and a bottom surface forming a bottom of the second hollow, and wherein the first surface layer of the first connection structure is spaced apart from the second surface layer covering the bottom surface of the second hollow.

15. The semiconductor package of claim 8, further comprising a bump structure disposed between the lower substrate and the semiconductor chip, and electrically connecting a connection pad of the semiconductor chip to the lower wiring layer.

16. The semiconductor package of claim 15, wherein the bump structure comprises:

a third connection structure disposed on the lower wiring layer and having a third hollow open toward the semiconductor chip;

a fourth connection structure disposed below the connection pad and having a fourth hollow open toward the lower substrate; and a connection member filling at least a portion of the third hollow and the fourth hollow, wherein the third connection structure is inserted into the fourth connection structure.

17. A semiconductor package, comprising:

a lower substrate including a lower wiring layer;

a semiconductor chip disposed on the lower substrate, and electrically connected to the lower wiring layer;

an upper substrate disposed on the semiconductor chip, and including an upper wiring layer;

a first connection structure disposed on the lower wiring layer, and protruding toward the upper substrate, wherein the first connection structure has a first hollow open toward the upper substrate;

a second connection structure disposed below the upper wiring layer, and protruding toward the lower substrate to partially surround the first connection structure;

a surface layer covering at least a portion of a surface of the first connection structure; and a conductive connection member extending along the surface layer between the first connection structure and the second connection structure, wherein the first connection structure has an outer surface facing the second connection structure, an inner surface opposite to the outer surface, and a bottom surface extended from one end of the inner surface, wherein the surface layer covers the inner surface and the bottom surface of the first connection structure, wherein the conductive connection member fills the first connection structure along the surface layer, and wherein the conductive connection member comprises a first lower end in the first hollow, and a second lower end outside of the first hollow, and the first lower end is a same distance as the second lower end to the lower substrate or closer than the second lower end to the lower substrate.

18. The semiconductor package of claim 17, wherein the first hollow is defined by the inner surface and the bottom surface of the first connection structure, and wherein the surface layer extends along an inner wall of the first hollow.

19. The semiconductor package of claim 18, wherein the conductive connection member extends into the first hollow along the surface layer.

20. The semiconductor package of claim 17, wherein the surface layer comprises gold (Au) or an alloy including the gold (Au).

* * * * *